(12) United States Patent
Hara et al.

(10) Patent No.: US 11,152,037 B2
(45) Date of Patent: Oct. 19, 2021

(54) SEMICONDUCTOR MEMORY DEVICE

(71) Applicant: KIOXIA CORPORATION, Tokyo (JP)

(72) Inventors: Hiroyuki Hara, Fujisawa Kanagawa (JP); Hiroyuki Takenaka, Kamakura Kanagawa (JP); Akihiko Chiba, Yokohama Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 18 days.

(21) Appl. No.: 16/803,343

(22) Filed: Feb. 27, 2020

(65) Prior Publication Data
US 2021/0083182 A1 Mar. 18, 2021

(30) Foreign Application Priority Data
Sep. 18, 2019 (JP) .............................. JP2019-169910

(51) Int. Cl.
*G11C 5/14* (2006.01)
*H01L 45/00* (2006.01)
(Continued)

(52) U.S. Cl.
CPC .............. *G11C 5/14* (2013.01); *G11C 5/025* (2013.01); *G11C 5/06* (2013.01); *G11C 8/14* (2013.01);
(Continued)

(58) Field of Classification Search
CPC .. G11C 5/14; G11C 5/06; G11C 5/025; G11C 8/14; G11C 13/0028;
(Continued)

(56) References Cited

U.S. PATENT DOCUMENTS 8,619,453 B2 12/2013 Scheuerlein
9,190,147 B2 11/2015 Minemura et al.
(Continued)

OTHER PUBLICATIONS

Y. Kim et al., "A Vertical 4-Bit SONOS Flash Memory and a Unique 3-D Vertical nor Array Structure," in IEEE Transactions on Nanotechnology, vol. 9, No. 1, pp. 70-77, Jan. 2010, doi: 10.1109/TNANO.2009.2026173. (Year: 2010).*
(Continued)

*Primary Examiner* — Ajay Ojha
(74) *Attorney, Agent, or Firm* — Kim & Stewart LLP (57) ABSTRACT

A semiconductor memory device includes first and second wirings extending in a first direction and spaced apart from each other in the first direction, third wirings above the first and second wirings and extending in a second direction, fourth and fifth wirings above the third wirings, extending in the first direction, and spaced apart from each other in the second direction, a plurality of memory cells between each third wiring and each of first, second, fourth, and fifth wirings, voltage application circuits, connection conductors between the voltage application circuits and the wirings, and connection wirings that electrically connect the fourth and fifth wirings to the voltage application circuits. The voltage application circuits are arranged so that a non-selected voltage application circuit is under a space between the first and second wirings, and a selected voltage application circuit is under the first wiring.

18 Claims, 7 Drawing Sheets

(51) Int. Cl.
  *H01L 27/24* (2006.01)
  *G11C 13/00* (2006.01)
  *G11C 5/06* (2006.01)
  *G11C 5/02* (2006.01)
  *G11C 8/14* (2006.01)

(52) U.S. Cl.
  CPC ...... *G11C 13/0026* (2013.01); *G11C 13/0028* (2013.01); *H01L 27/2463* (2013.01); *H01L 45/122* (2013.01)

(58) Field of Classification Search
  CPC ............ G11C 13/0026; G11C 2213/71; G11C 13/0023; G11C 13/0038; H01L 27/2463; H01L 45/122
  See application file for complete search history.

(56) References Cited

U.S. PATENT DOCUMENTS

| | | | |
|---|---|---|---|
| 11,011,208 B2 * | 5/2021 | Lim | ........................ G11C 5/025 |
| 2019/0050169 A1 | 2/2019 | Komai | |

OTHER PUBLICATIONS

Seiichi Aritome, "Nand Flash Memory Devices," in NAND Flash Memory Technologies , IEEE, 2015, pp. 37-92, doi: 10.1002/9781119132639.ch3. (Year: 2015).*

* cited by examiner

SEMICONDUCTOR MEMORY DEVICE

CROSS-REFERENCE TO RELATED APPLICATION(S)

This application is based upon and claims the benefit of priority from Japanese Patent Application No. 2019-169910, filed Sep. 18, 2019, the entire contents of which are incorporated herein by reference.

FIELD

An embodiment described herein relates generally to a semiconductor memory device.

BACKGROUND

A cross-point type memory device using a variable resistance element is attracting attention as being capable of easily providing a large-capacity storage device in comparison to the related art.

In the cross-point type memory device, a large number of wirings called bit lines and word lines cross over each other and memory cells are formed at the intersections of the bit lines and the word lines. One memory cell is written by applying a voltage or a current to the bit line and the word line connected to the cell.

DETAILED DESCRIPTION

An embodiment provides a semiconductor memory device having a simple wiring structure.

In general, according to one embodiment, a semiconductor memory device includes a substrate, first and second wirings above the substrate, extending in a first direction parallel to a substrate surface, and spaced apart from each other in the first direction, a plurality of third wirings above the first wiring and the second wiring and extending in a second direction intersecting the first direction, fourth and fifth wirings above the plurality of third wirings, extending in the first direction, and spaced apart from each other in the second direction, a plurality of memory cells between the first wiring and the third wirings, between the second wiring and the third wirings, between the fourth wiring and the third wirings, and between the fifth wiring and the third wirings, a first non-selected voltage application circuit on the substrate and under a space between the first wiring and the second wiring, a second non-selected voltage application circuit on the substrate and under the first wiring, a first selected voltage application circuit on the substrate between the first non-selected voltage application circuit and the second non-selected voltage application circuit, a second selected voltage application circuit on the substrate between the second non-selected voltage application circuit and the first selected voltage application circuit, a first connection conductor between the substrate and the first wiring, a second connection conductor between the substrate and the first connection conductor, a first connection wiring extending in a third direction intersecting the first direction and the second direction through the space between the first wiring and the second wiring to connect the fourth wiring to the second connection conductor, a second connection wiring extending in the third direction to connect the fifth wiring to the first connection conductor, third and fourth connection wirings extending in the third direction to connect the second connection conductor to the first non-selected voltage application circuit and the first selected voltage application circuit, respectively, and fifth and sixth connection wirings extending in the third direction to connect the first connection conductor to the second non-selected voltage application circuit and the second selected voltage application circuit, respectively.

Hereinafter, an embodiment will be described with reference to drawings. In the drawings, the same or similar elements are denoted by the same or similar reference numerals.

In the present specification, in order to illustrate the positional relationship of components and the like, the upward direction of the drawing is described as "up" and the downward direction of the drawing is described as "down". In the present specification, the concepts of "up", "on", "above", "over", "down", "below", and "under" are not necessarily terms indicating the relationship with the direction of gravity.

Embodiment

Figure 1:
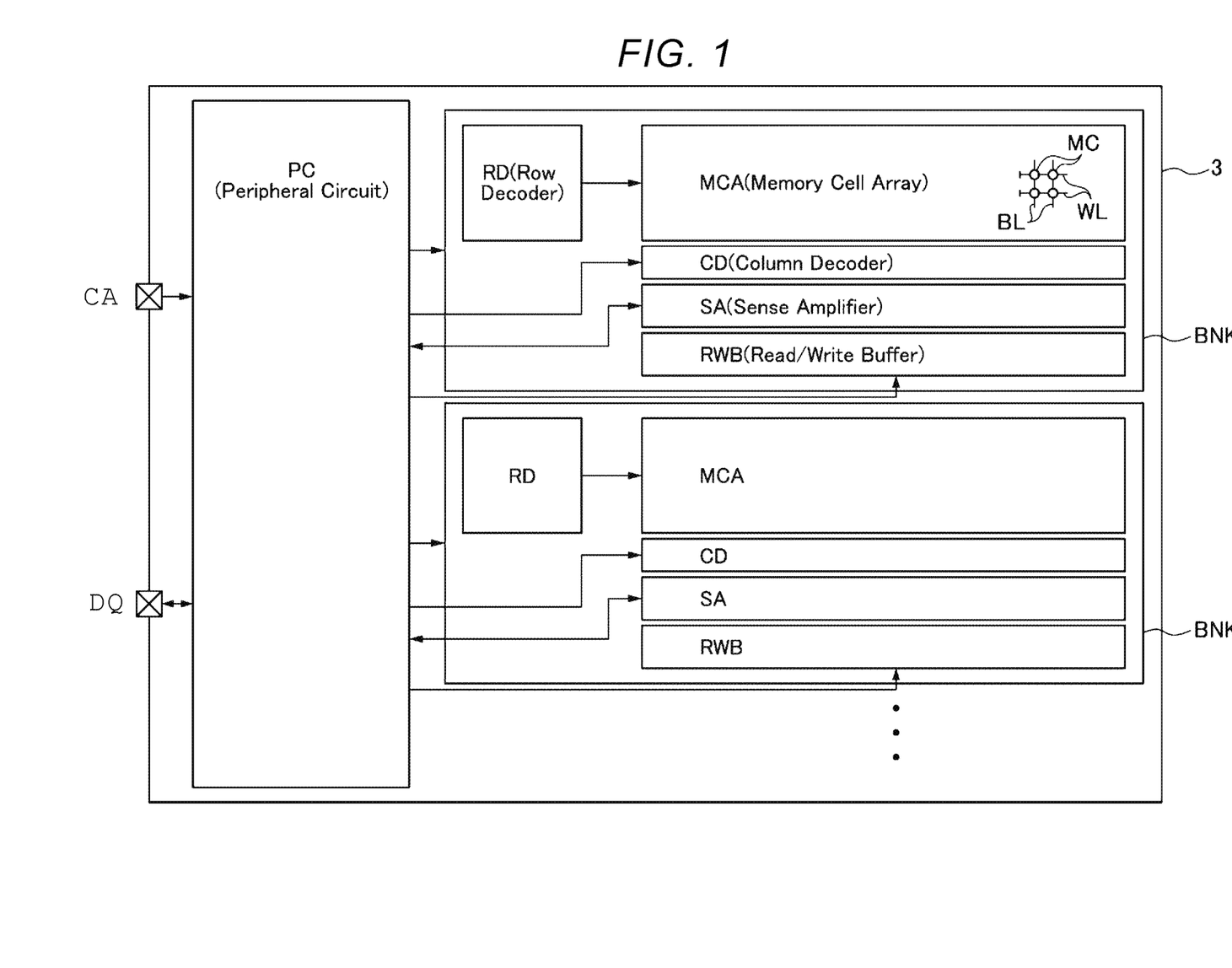
FIG. 1 is a block view illustrating a configuration of a memory system according to an embodiment.

FIG. 1 is a block view illustrating a configuration of a memory system 3 according to the embodiment.

The memory system 3 illustrated in FIG. 1 includes a memory cell array MCA, a column decoder CD, a row decoder RD, a sense amplifier SA, a read/write buffer RWB, and a peripheral circuit PC.

The memory cell array MCA includes a plurality of memory cells MC that are two-dimensionally arranged in a matrix, for example. The memory cell MC is, for example, a resistance change type memory such as ReRAM. In other examples, the memory cell MC may be, for example, a volatile memory such as dynamic random-access memory (DRAM), or a nonvolatile memory such as NAND-type electrically erasable and programmable read-only-memory (EEPROM), or magnetoresistive RAM (MRAM). For example, the memory cell MC is disposed at the intersection of a bit line BL and a word line WL. That is, the memory cell array MCA is a so-called cross-point type memory cell array. When viewed from above or from the side of a semiconductor substrate, the bit line BL is substantially orthogonal to the word line WL. A plurality of bit lines BL are connected to one end of memory cells MC in the memory cell array MCA. A plurality of word lines WL are connected to gate terminals of the memory cells MC of the memory cell array MCA. The memory cell array MCA is divided into a plurality of banks BNK, and a sense amplifier SA, a data latch DL, an address latch AL, and the like are provided for each bank BNK.

For example, the sense amplifier SA is connected to the memory cell MC via the bit line BL and applies a write voltage or a read voltage to the memory cell MC via the bit line BL. The sense amplifier SA writes data to the memory cell MC by applying a write voltage to the memory cell MC or reads data from the memory cell MC by applying a read voltage to the memory cell MC.

The read/write buffer RWB temporarily stores the data and address detected by the sense amplifier SA for each page or temporarily stores the data and address to be written to the memory cell array MCA for each page.

The row decoder RD and the column decoder CD access the memory cell array MCA based on the bank address and page address and apply a write voltage and a read voltage to the word line WL and the bit line BL. The row decoder RD applies a write voltage or a read voltage to a selected word line selected from the plurality of word lines WL. The column decoder CD connects a selected bit line selected from the plurality of bit lines BL to the sense amplifier SA. The sense amplifier SA applies a write voltage or a read voltage to the selected bit line. Thereby, the memory system 3 can write data to a desired memory cell MC in the memory cell MC or read data from the desired memory cell MC.

Figure 2:
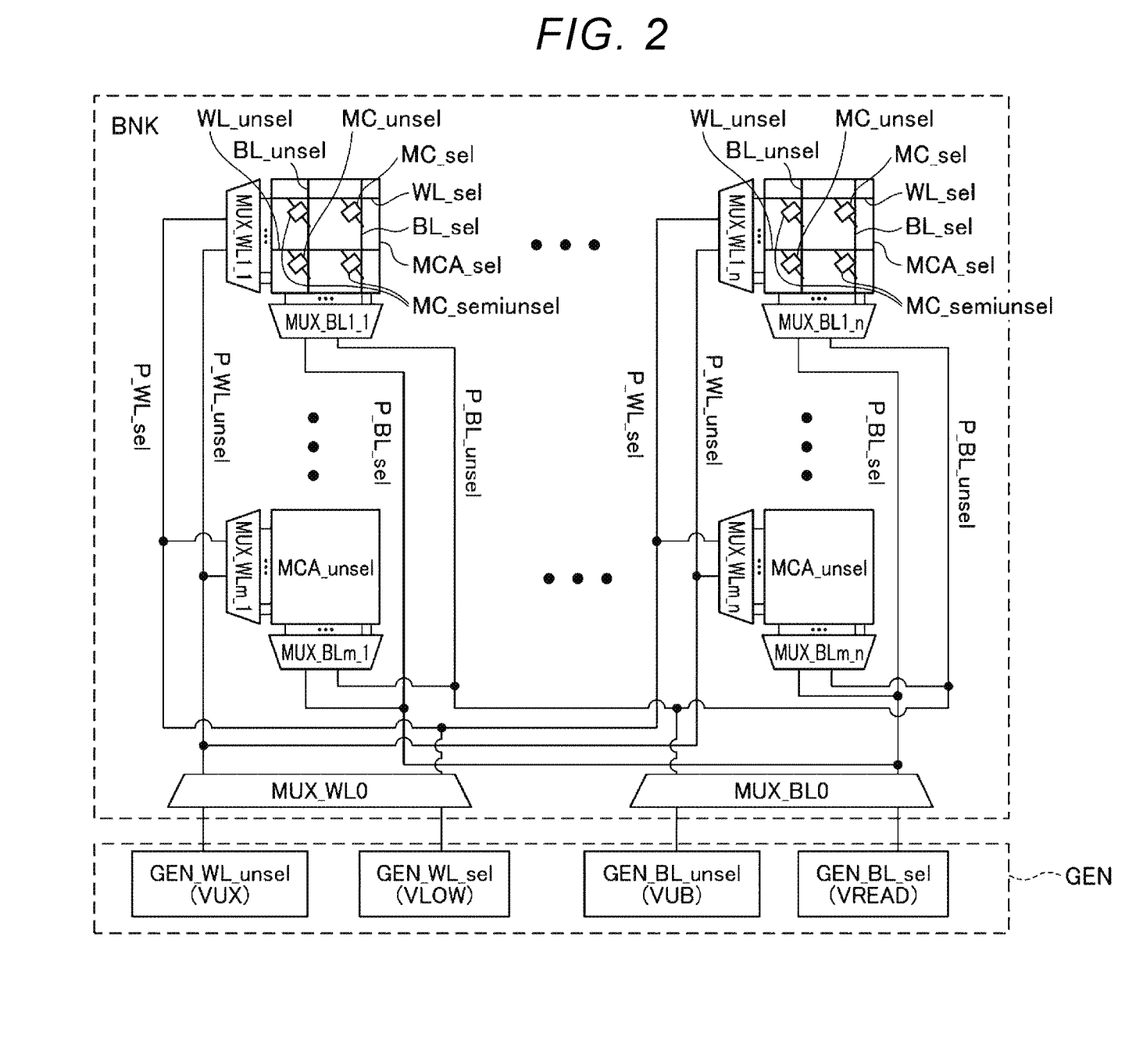
FIG. 2 is a block view illustrating a detailed configuration example of a bank, a column decoder, and a row decoder according to the embodiment.

The peripheral circuit PC includes, for example, a voltage generation circuit, a read/write engine, an address controller, a command controller, an input/output circuit (not illustrated), and the like. A voltage generation circuit GEN generates the voltage of the word line WL and the voltage of the bit line BL necessary for a data read operation and a data write operation. A more detailed configuration of the voltage generation circuit GEN is illustrated in FIG. 2. The read/write engine controls the column decoder CD and the row decoder RD to write data to the desired memory cell MC in the bank BNK according to a command and an address or read data from the desired memory cell MC in the bank BNK. The read/write engine transfers the read data to a DQ buffer of the input/output circuit. The address controller receives a row address and a column address and decodes these addresses. The command controller receives commands indicating various operations such as a data read operation and a data write operation and transfers these commands to the read/write engine. The input/output circuit (IO) receives a command and an address from a CA (command/address) terminal CA, transfers the command to the command controller, and the address to the address controller. The command may be a write command for instructing a write operation or a read command for instructing a read operation. The address may be a bank address indicating any bank BNK of the memory cell array MCA, and an address indicating a page or memory cell MC to be read or written in the bank BNK. The input/output circuit receives the write data from a DQ (Data-in, Query-Output) terminal DQ and transfers the write data to the read/write buffer RWB. Alternatively, the input/output circuit receives the read data stored in the data latch DL and outputs the read data from the DQ terminal DQ.

A memory controller (not illustrated) that controls the entire plurality of memory systems 3 may be provided outside the memory system 3.

FIG. 2 is a block view illustrating a more detailed configuration example of the bank BNK, the column decoder CD, and the row decoder RD. The bank BNK includes the memory cell array, in particular a plurality of memory cell arrays that are subdivided corresponding to multiplexers MUX_BL1_1 to MUX_BLm_n and MUX_WL1_1 to MUX_WLm_n. Hereinafter, the subdivided memory cell arrays are referred to as MCA.

The memory system 3 includes the memory cell array MCA, multiplexers MUX_BL1_1 to MUX_BLm_n and MUX_BL0 as column decoders CD, and multiplexers MUX_WL1_1 to MUX_WLm_n and MUX_WL0 as row decoders RD, bit line paths P_BL_sel and P_BL_unsel, word line paths P_WL_sel and P_WL_unsel, a selected BL voltage generation circuit GEN_BL_sel, a non-selected BL voltage generation circuit GEN_BL_unsel, a selected WL voltage generation circuit GEN_WL_sel, and a non-selected WL voltage generation circuit GEN_WL_unsel.

The multiplexer is implemented by a switching element such as a metal oxide semiconductor field effect transistor (MOSFET).

The column decoder CD includes the multiplexers MUX_BL1_1 to MUX_BLm_n and MUX_BL0. The multiplexers MUX_BL1_1 to MUX_BLm_n are provided for the memory cell arrays MCA, respectively and are connected to the plurality of bit lines BL of each memory cell array MCA. The variables, m and n, are each an integer of 1 or more. The multiplexers MUX_BL1_1 to MUX_BLm_n connect one selected bit line BL_sel selected from the bit lines BL of the corresponding memory cell array MCA to a selected bit line path P_BL_sel and apply a selected bit line voltage VREAD. The multiplexers MUX_BL1_1 to MUX_BLm_n connect a non-selected bit line BL_unsel other than the selected bit line BL_sel to a non-selected bit line path P_BL_unsel and apply a non-selected bit line voltage VUB. Alternatively, the multiplexers MUX_BL1_1 to MUX_BLm_n place the non-selected bit line BL_unsel in a floating state and do not apply a voltage.

The multiplexer MUX_BL0 is connected between the selected BL voltage generation circuit GEN_BL_sel and a plurality of bit line paths and between the non-selected BL voltage generation circuit GEN_BL_unsel and the plurality of bit line paths. The multiplexer MUX_BL0 connects one selected bit line path P_BL_sel among the plurality of bit line paths to the selected BL voltage generation circuit GEN_BL_sel. On the other hand, the multiplexer MUX_BL0 connects the non-selected bit line path as P_BL_unsel among the plurality of bit line paths to the non-selected BL voltage generation circuit GEN_BL_unsel.

The bit line paths P_BL_sel and P_BL_unsel are wiring paths connected between the multiplexers MUX_BL1_1 to MUX_BLm_n and the multiplexer MUX_BL0. For example, 32 or 64 bit line paths are provided. As described above, the multiplexer MUX_BL0 selects one of the plurality of bit line paths and connects the selected bit line path P_BL_sel to the selected BL voltage generation circuit GEN_BL_sel. The selected bit line path P_BL_sel transmits the selected bit line voltage VREAD. On the other hand, the multiplexer MUX_BL0 connects the non-selected bit line path P_BL_unsel among the plurality of bit line paths to the non-selected BL voltage generation circuit GEN_BL_unsel. The bit line path P_BL_unsel transmits the non-selected bit line voltage VUB. The selected BL voltage generation circuit GEN_BL_sel generates the selected bit line voltage VREAD applied to the selected bit line BL_sel from an external power supply. The selected bit line voltage VREAD is a high-level voltage, for example, several volts. The selected bit line path P_BL_sel transmits the selected bit line voltage VREAD from the multiplexer MUX_BL0 to the multiplexers MUX_BL1_1 to MUX_BLm_n. The multiplexers MUX_BL1_1 to MUX_BLm_n and MUX_BL0 electrically connect the selected bit line BL_sel among the plurality of bit lines BL to the selected BL voltage generation circuit GEN_BL_sel via the selected bit line path P_BL_sel and selectively apply the selected bit line voltage VREAD to the selected bit line BL_sel.

The non-selected BL voltage generation circuit GEN_BL_unsel generates the non-selected bit line voltage VUB applied to the non-selected bit line BL_unsel from an external power supply. The non-selected bit line voltage VUB is a voltage between the selected bit line voltage VREAD and a selected word line voltage VLOW, for example, VREAD/2. The non-selected bit line path P_BL_unsel transmits the non-selected bit line voltage VUB from the multiplexer MUX_BL0 to the multiplexers MUX_BL1_1 to MUX_BLm_n. The multiplexers MUX_BL0 and MUX_BL1_1 to MUX_BLm_n electrically connect the non-selected bit line BL_unsel to the non-selected BL voltage generation circuit GEN_BL_unsel via the non-selected bit line path P_BL_unsel and selectively apply the non-selected bit line voltage VUB to the non-selected bit line BL_unsel. Alternatively, the multiplexers MUX_BL0 and MUX_BL1_1 to MUX_BLm_n do not apply a voltage to the non-selected bit line BL_unsel.

The row decoder RD includes multiplexers MUX_WL1_1 to MUX_WLm_n and MUX_WL0. The multiplexers MUX_WL1_1 to MUX_WLm_n are provided for the memory cell arrays MCA, respectively, and are connected to the plurality of word lines WL of each memory cell array MCA. The multiplexers MUX_WL1_1 to MUX_WLm_n connect one selected word line WL_sel selected from the word lines WL of the corresponding memory cell array MCA to the word line path P_WL_sel and apply the selected word line voltage VLOW. The multiplexers MUX_WL1_1 to MUX_WLm_n connect non-selected word lines WL_unsel other than the selected word line WL_sel to a word line path P_WL_unsel and apply a non-selected word line voltage VUX. The multiplexer MUX_WL0 is connected between the selected WL voltage generation circuit GEN_WL_sel and a plurality of word line paths and between the non-selected WL voltage generation circuit GEN_WL_unsel and the plurality of word line paths. The multiplexer MUX_WL0 connects one selected word line path P_WL_sel among the plurality of word line paths to the selected WL voltage generation circuit GEN_WL_sel. On the other hand, the multiplexer MUX_WL0 connects a non-selected word line path as P_WL_unsel among the plurality of word line paths to the non-selected WL voltage generation circuit GEN_WL_unsel.

The word line paths P_WL_sel and P_WL_unsel are wiring paths connected between the multiplexers MUX_WL1_1 to MUX_WLm_n and the multiplexer MUX_WL0. For example, 32 or 64 word line paths are provided. As described above, the multiplexer MUX_WL0 selects one of the plurality of word line paths and connects the selected word line path P_WL_sel to the selected WL voltage generation circuit GEN_WL_sel. The word line path P_WL_sel transmits the selected word line voltage VLOW. On the other hand, the multiplexer MUX_WL0 connects a non-selected word line path P_WL_unsel among the plurality of word line paths to the non-selected WL voltage generation circuit GEN_WL_unsel. The word line path P_WL_unsel transmits the non-selected word line voltage VUX. The selected WL voltage generation circuit GEN_WL_sel generates the selected word line voltage VLOW applied to the selected word line WL_sel from an external power supply. The selected word line voltage VLOW is a low-level voltage, for example, a ground voltage (0 V). The word line path P_WL_sel transmits the selected word line voltage VLOW from the multiplexer MUX_WL0 to the multiplexers MUX_WL1_1 to MUX_WLm_n. The multiplexers MUX_WL1_1 to MUX_WLm_n and MUX_WL0 electrically connect the selected word line WL_sel among the plurality of word lines WL to the selected WL voltage generation circuit GEN_WL_sel via the selected word line path P_WL_sel and selectively apply the selected word line voltage VLOW to the selected word line WL_sel.

The non-selected WL voltage generation circuit GEN_WL_unsel generates the non-selected word line voltage VUX applied to the non-selected word line WL_unsel from an external power supply. The non-selected word line voltage VUX is a voltage between the selected bit line voltage VREAD and the selected word line voltage VLOW, and is, for example, VREAD/2. The non-selected word line voltage VUX is preferably substantially equal to the non-selected bit line voltage VUB. However, the non-selected word line voltage VUX may be different from the non-selected bit line voltage VUB. The non-selected word line path P_WL_unsel transmits the non-selected word line voltage VUX from the multiplexer MUX_WL0 to the multiplexers MUX_WL1_1 to MUX_WLm_n. The multiplexers MUX_WL1_1 to MUX_WLm_n electrically connect the non-selected word line WL_unsel to the non-selected WL voltage generation circuit GEN_WL_unsel via the non-selected word line path P_WL_unsel and selectively apply the non-selected word line voltage VUX to the non-selected word lines WL_unsel.

In this way, the voltage difference between the selected bit line voltage VREAD and the selected word line voltage VLOW is applied to the selected memory cell MC sel connected to the selected bit line BL_sel and the selected word line WL_sel. Thereby, data is read from the selected memory cell MC sel, or data is written to the selected memory cell MC sel.

The configurations of the bank BNK, column decoder CD, and row decoder RD are not limited thereto. For example, the connection mode between each multiplexer and each memory cell array MCA is not limited thereto.

Figure 3A:
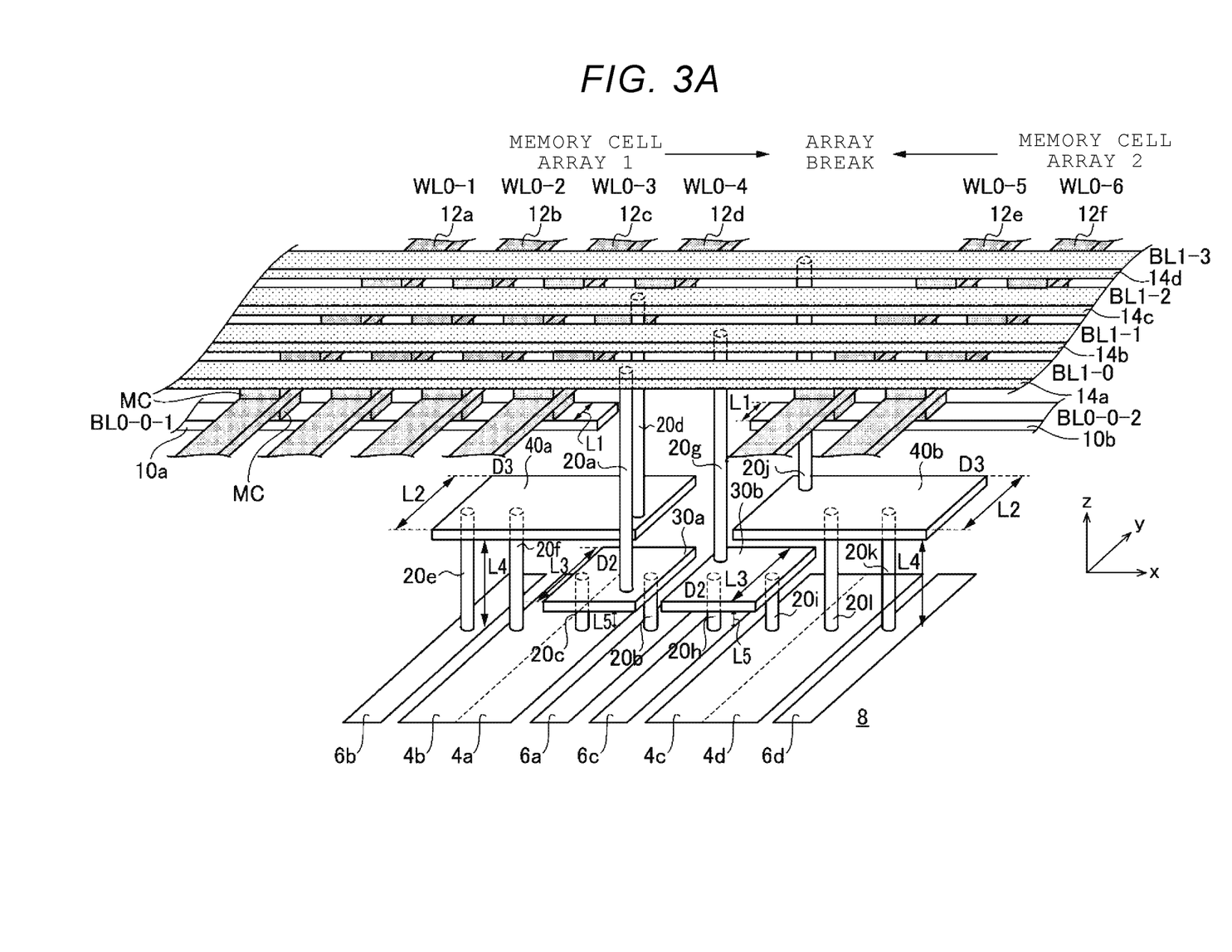
FIGS. 3A and 3B are schematic views of a semiconductor memory device according to the embodiment.
Figure 3B:
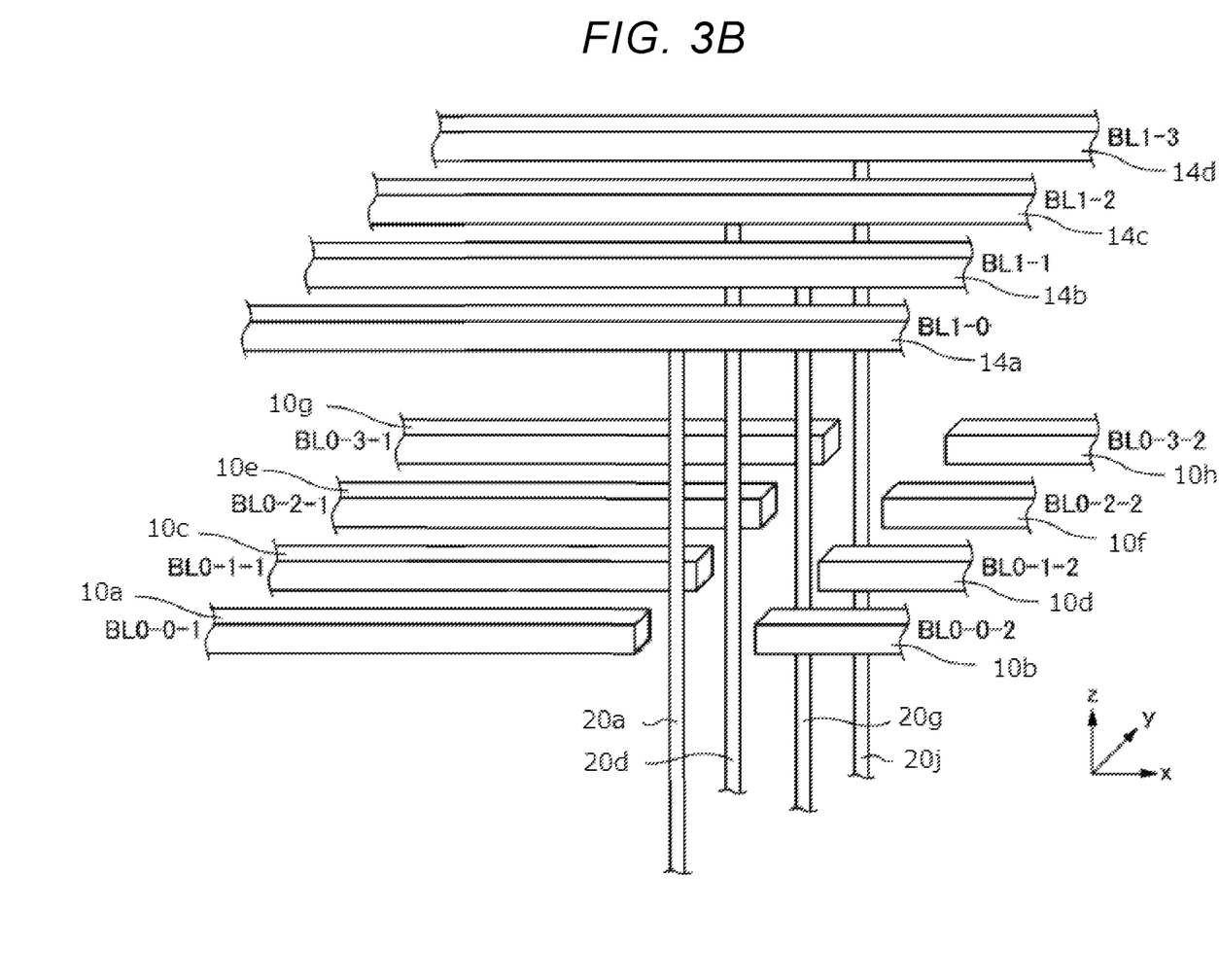

FIGS. 3A and 3B are schematic views of a semiconductor memory device 100 according to the embodiment.

Here, an x axis, a y axis perpendicular to the x axis, and a z axis perpendicular to the x axis and the y axis are defined. In FIG. 3B, only bit lines and a part of vias are illustrated.

The semiconductor memory device 100 includes a memory cell array 1 and a memory cell array 2 as the memory cell array MCA illustrated in FIGS. 1 and 2.

As shown in FIGS. 3A and 3B, a bit line BL0-0-1 10*a* extends in parallel with the x direction. A bit line BL0-0-2 10*b* is spaced apart from the bit line BL0-0-1 10*a* in the x direction and also extends in the x direction. In other words, the bit line BL0-0-1 10*a* and the bit line BL0-0-2 10*b* are provided so that one bit line BL is cut between a portion corresponding to the memory cell array 1 and a portion corresponding to the memory cell array 2. The bit line BL0-0-1 10*a* and the bit line BL0-0-2 10*b* do not necessarily have to be formed by cutting one bit line BL in the manufacturing process. As shown in FIG. 3B, the other bit lines BL0-1-1 10*c*, BL0-2-1 10*e* and BL0-3-1 10*g* are provided in parallel with the bit line BL0-0-1 10*a*, and the other bit lines BL0-1-2 10*d*, BL0-2-2 10*f* and BL0-3-2 10*h* are provided in parallel with the bit line BL0-0-2 10*b*. The bit lines BL0-0-1 10*a*, BL0-0-2 10*b*, BL0-1-1 10*c*, BL0-1-2 10*d*, BL0-2-1 10*e*, BL0-2-2 10*f*, BL0-3-1 10*g* and BL0-3-2 10*h* may be collectively referred to as BL0. Especially, BL0-0-1 10*a* and BL0-0-2 10*b* may be representatively taken as an example with reference to FIG. 3A for the sake of simplification.

Word lines WL0-1 12*a*, WL0-2 12*b*, WL0-3 12*c*, and WL0-4 12*d* are provided on the bit line BL0-0-1 10*a* and extend in parallel with the y direction. Word lines WL0-5 12*e* and WL0-6 12*f* are provided on the bit line BL0-0-2 10*b* and extend in parallel with the y direction. Hereinafter, WL0-1 12*a*, WL0-2 12*b*, WL0-3 12*c*, WL0-4 12*d*, WL0-5 12*e*, and WL0-6 12*f* may be collectively referred to as WL0.

A bit line BL1-0 14*a* is provided on the word line WL0 over the bit line BL0-0-1 10*a* and the bit line BL0-0-2 10*b* and extends in the x direction.

BL1-1 14*b* is provided on WL0 over BL0-0-1 10*a* and BL0-0-2 10*b*, to be spaced apart from BL1-0 14*a* in the y direction, and extends in the x direction.

A bit line BL1-2 14*c* is provided on the word line WL0 over the bit line BL0-0-1 10*a* and the bit line BL0-0-2 10*b*, to be spaced apart from the bit line BL1-1 14*b* in the y direction, and extends in the x direction.

A bit line BL1-3 14*d* is provided on the word line WL0 over the bit line BL0-0-1 10*a* and the bit line BL0-0-2 10*b*, to be spaced apart from the bit line BL1-2 14*c* in the y direction, and extends in the x direction.

In other words, BL1-0 14*a*, BL1-1 14*b*, BL1-2 14*c*, and BL1-3 14*d* are arranged side by side in the y direction. BL1-1 14*b* is provided between BL1-0 14*a* and BL1-2 14*c*. BL1-2 14*c* is provided between BL1-1 14*b* and BL1-3 14*d*. In the following, BL1-0 14*a*, BL1-1 14*b*, BL1-2 14*c* and BL1-3 14*d* may be collectively referred to as BL1.

The memory cell MC is provided between each of BLs and WLs.

The memory cell array 1 includes BL0-0-1 10*a*, WL0-1 12*a*, WL0-2 12*b*, WL0-3 12*c*, WL0-4 12*d*, BL1-0 14*a*, BL1-1 14*b*, BL1-2 14*c*, BL1-3 14*d*, and memory cells MC provided between the BL and the WL, respectively.

The memory cell array 2 includes BL0-0-2 10*b*, WL0-5 12*e*, WL0-6 12*f*, BL1-0 14*a*, BL1-1 14*b*, BL1-2 14*c*, BL1-3 14*d*, and memory cells MC provided between the BLs and the WLs, respectively.

A plurality of BL0s (not illustrated) used in the memory cell array 1 are provided under WL0-1 12*a*, WL0-2 12*b*, WL0-3 12*c*, and WL0-4 12*d* to be spaced apart from BL0-0-1 10*a* in the y direction. The plurality of BL0s (not illustrated) used in the memory cell array 2 are provided under WL0-5 12*e* and WL0-6 12*f* to be spaced apart from BL0-0-2 10*b* in the y direction. A memory cell MC is also provided between each of the plurality of BL0s and WL0s (not illustrated).

In the memory cell array 1 and the memory cell array 2, BL1-0 14*a*, BL1-1 14*b*, BL1-2 14*c*, and BL1-3 14*d* are used in common. On the other hand, BL0-0-1 10*a*, BL0-0-2 10*b*, and other BLs disposed under WL0 are not commonly used in the memory cell array 1 and the memory cell array 2. BL1-0 14*a*, BL1-1 14*b*, BL1-2-14*c*, and BL1-3 14*d* are provided between the memory cell array 1 and the memory cell array 2, but there is a region (referred to as an array break) where the memory cell MC is not provided.

Figure 4A:
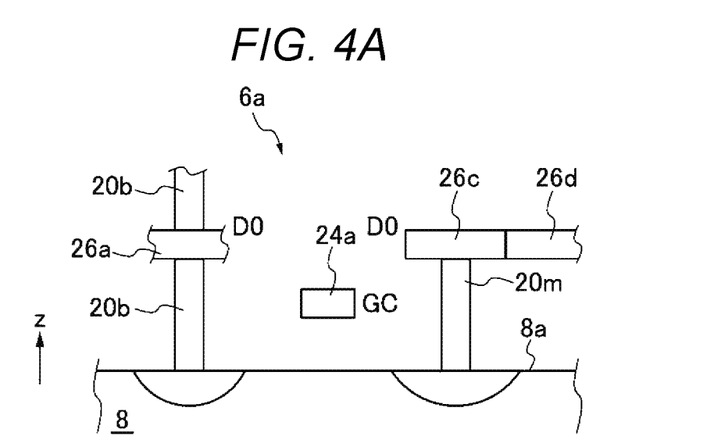
FIGS. 4A and 4B are schematic views of a first non-selected voltage application circuit and a second selected voltage application circuit according to the embodiment.

A first non-selected voltage application circuit 6*a* is provided on a substrate 8 under a portion between BL0-0-1 10*a* and BL0-0-2 10*b*. In other words, the first non-selected voltage application circuit 6*a* is provided on the substrate 8 under the array break. The phrase "provided on the substrate 8" includes, for example, the case where a substrate surface 8*a* itself of the substrate 8 functions as the first non-selected voltage application circuit 6*a* and may include the case where the first non-selected voltage application circuit 6*a* includes the substrate 8 and a wiring layer formed thereon as illustrated in FIG. 4.

A second non-selected voltage application circuit 6*b* is provided on the substrate 8 under BL0-0-1 10*a*.

A first selected voltage application circuit 4*a* is provided on the substrate 8 between the first non-selected voltage application circuit 6*a* and the second non-selected voltage application circuit 6*b*.

A second selected voltage application circuit 4*b* is provided on the substrate 8 between the second non-selected voltage application circuit 6*b* and the first selected voltage application circuit 4*a*.

A third non-selected voltage application circuit 6*c* is provided on the substrate 8 under a portion between BL0-0-1 10*a* and BL0-0-2 10*b* so that the first non-selected voltage application circuit 6*a* is provided between the first selected voltage application circuit 4*a* and the third non-selected voltage application circuit 6*c*. In other words, the third non-selected voltage application circuit 6*c* is provided on the substrate 8 under the array break so that the first non-selected voltage application circuit 6*a* is provided between the first selected voltage application circuit 4*a* and the third non-selected voltage application circuit 6*c*.

A fourth non-selected voltage application circuit 6*d* is provided on the substrate 8 under BL0-0-2 10*b*.

A third selected voltage application circuit 4*c* is provided between the third non-selected voltage application circuit 6*c* and the fourth non-selected voltage application circuit 6*d*.

A fourth selected voltage application circuit 4*d* is provided between the third selected voltage application circuit 4*c* and the fourth non-selected voltage application circuit 6*d*.

The first selected voltage application circuit 4*a*, the second selected voltage application circuit 4*b*, the third selected voltage application circuit 4*c*, and the fourth selected voltage application circuit 4*d* are examples of the multiplexers MUX_BL1_1 to MUX_BLm_n. The first non-selected voltage application circuit 6*a*, the second non-selected voltage application circuit 6*b*, the third non-selected voltage application circuit 6*c*, and the fourth non-selected voltage application circuit 6*d* are examples of the multiplexers MUX_WL1_1 to MUX_WLm_n.

The first selected voltage application circuit 4*a*, the second selected voltage application circuit 4*b*, the third selected voltage application circuit 4*c*, and the fourth selected voltage application circuit 4*d* are, for example, electric circuits using N-type MOSFETs. The first non-selected voltage application circuit 6*a*, the second non-selected voltage application circuit 6*b*, the third non-selected voltage application circuit 6*c*, and the fourth non-selected voltage application circuit 6*d* are, for example, electric circuits using P-type MOSFETs.

The first selected voltage application circuit 4*a* and the second selected voltage application circuit 4*b* may be formed on the substrate 8 so as to be adjacent to each other or may be formed as separate circuits with a predetermined interval on the substrate 8. The third selected voltage application circuit 4*c* and the fourth selected voltage application circuit 4*d* may be formed on the substrate 8 so as to be adjacent to each other or may be formed as separate circuits with a predetermined interval on the substrate 8.

A via 20*a* is provided between BL0-0-1 10*a* and BL0-0-2 10*b* in the y direction (when viewed from the y direction), extends in parallel with the z direction, and connects the first non-selected voltage application circuit 6*a* and BL1-0 14*a* through a via 20*b*.

A connection conductor 30a is provided between the substrate 8 and BL0-0-1 10a and is connected to the vias 20a and 20b. The connection conductor 30a is, for example, a rectangular parallelepiped conductor, but is not limited thereto. The vias 20a and 20b may be formed as an integral single via which penetrates to be connected to the first non-selected voltage application circuit 6a through the D2 level layer without an intervention of the connection conductor 30a, and the connection mode is not limited to that illustrated in FIG. 3A.

A via 20c connects the connection conductor 30a and the first selected voltage application circuit 4a. The via 20c extends in parallel with the z direction, for example, but is not limited thereto.

A connection conductor 40a is provided between the connection conductor 30a and BL0-0-1 10a.

A via 20d extends in parallel with the z direction. The via 20d is provided between BL0-0-1 10a and the via 20a when viewed along the y direction. The via 20d connects BL1-2 14c and the connection conductor 40a.

A via 20e is provided between the connection conductor 40a and the second non-selected voltage application circuit 6b and connects the connection conductor 40a and the second non-selected voltage application circuit 6b.

A via 20f is provided between the via 20c and the via 20e when viewed along the y direction and connects the connection conductor 40a and the second selected voltage application circuit 4b.

A via 20g extends in parallel with the z direction. The via 20g is provided between the via 20a and BL0-0-2 10b when viewed along the y direction. The via 20g connects the third non-selected voltage application circuit 6c and BL1-1 14b through a via 20h.

A connection conductor 30b is provided between the substrate 8 and BL0-0-2 10b and is connected to the vias 20g and 20h. The connection conductor 30b is, for example, a rectangular parallelepiped conductor, but is not limited thereto. The vias 20g and 20h may be formed as an integral single via which penetrates to be connected to the third non-selected voltage application circuit 6c through the D2 level layer without an intervention of the connection conductor 30b, and the connection mode is not limited to that illustrated in FIG. 3A.

A via 20i connects the connection conductor 30b and the third selected voltage application circuit 4c.

A connection conductor 40b is provided between the connection conductor 30b and BL0-0-2 10b.

A via 20j extends in the z direction. The via 20j is provided between BL0-0-2 10b and the via 20g when viewed along the y direction. The via 20j connects BL1-3 14d and the connection conductor 40b.

A via 20k is provided between the connection conductor 40b and the fourth non-selected voltage application circuit 6d and connects the connection conductor 40b and the fourth non-selected voltage application circuit 6d.

A via 20l is provided between the vias 20i and 20k when viewed along the y direction and connects the connection conductor 40b and the fourth selected voltage application circuit 4d.

An insulator (not illustrated) is provided around each via, each connection conductor, each BL, each WL, and each MC.

The connection conductor 30a, the connection conductor 30b, the connection conductor 40a, and the connection conductor 40b each have at least one planar surface that is parallel with the substrate surface 8a of the substrate 8.

The ratio of a width L3 of the connecting conductor 30a in the y direction parallel to the substrate surface 8a of the substrate 8, the width L3 of the connection conductor 30b in the y direction parallel to the substrate surface 8a of the substrate 8, a width L2 of the connection conductor 40a in the y direction parallel to the substrate surface 8a of the substrate 8 or the width L2 of the connection conductor 40b in the y direction parallel to the substrate surface 8a of the substrate 8, to a width L1 of BL or WL in the y direction parallel to the substrate surface 8a of the substrate 8 is greater than 2. For example, L2/L1 is greater than 2. L3/L1 is greater than 2. More preferably, L2/L1 is greater than 3 and $L_3/L1$ is greater than 3. Also, in a general manufacturing process, L2/L1 is equal to 4 and L3/L1 is equal to 4.

More generally, along any one direction parallel to the substrate surface 8a of the substrate 8, the ratio of the width of the connection conductor to the width of BL or WL is larger than 2, for example. More preferably, the ratio of the width of the connection conductor to the width of BL or WL in such a direction is 4. In FIG. 3A, the width of the connection conductor in the direction parallel to the y direction is illustrated, but the width of the connection conductor in the direction parallel to the x direction may be used.

The distance between the substrate 8 and the connection conductor 40a is equal to the distance between the substrate 8 and the connection conductor 40b and is L4. The distance between the substrate 8 and the connection conductor 30a is equal to the distance between the substrate 8 and the connection conductor 30b and is L5.

Figure 4B:
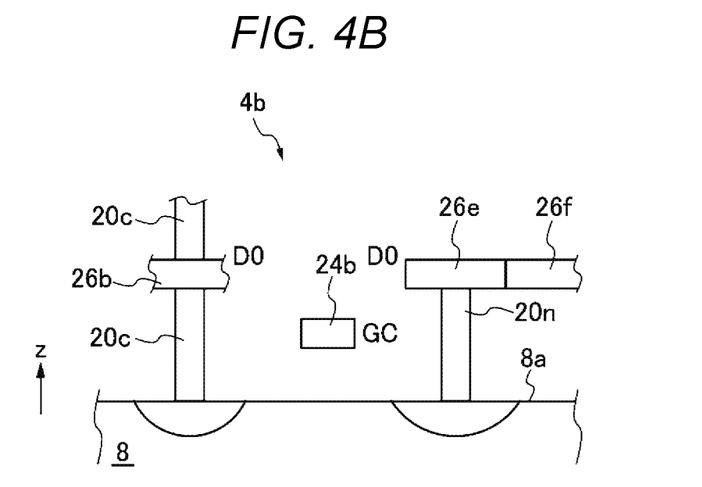

FIG. 4A is a schematic view of the first non-selected voltage application circuit 6a according to the embodiment. FIG. 4B is a schematic view of the second selected voltage application circuit 4b according to the embodiment.

The first non-selected voltage application circuit 6a is provided on the substrate 8, for example. The substrate 8 is a semiconductor substrate such as a Si substrate. The substrate 8 includes a substrate surface 8a. The via 20b is connected to, for example, the source or drain of a P-type MOSFET in the first non-selected voltage application circuit 6a. A conductor 24a faces the substrate surface 8a of the substrate 8 via an insulating film (not illustrated) and functions as the gate of the P-type MOSFET in the first non-selected voltage application circuit 6a. A via 20m is connected to, for example, the drain or source of the P-type MOSFET in the first non-selected voltage application circuit 6a. The via 20m is connected to a connection conductor 26c. The connection conductor 26c is connected to a connection conductor 26d. A connection conductor 26d is connected to, for example, a generator (e.g., voltage generation circuit, not illustrated) that generates a non-selected voltage. The mode of the first non-selected voltage application circuit 6a is not limited thereto.

Since the mode of the second non-selected voltage application circuit 6b, the third non-selected voltage application circuit 6c and the fourth non-selected voltage application circuit 6d is the same as the mode of the first non-selected voltage application circuit 6a, the description and illustration thereof is omitted.

The second selected voltage application circuit 4b is provided on the substrate 8, for example. The via 20c is connected to, for example, the source or drain of an N-type MOSFET in the second selected voltage application circuit 4b. A conductor 24b faces the substrate surface 8a of the substrate 8 via an insulating film (not illustrated) and functions as the gate of the N-type MOSFET in the second selected voltage application circuit 4b. A via 20n is connected to, for example, the drain or source of the N-type MOSFET in the second selected voltage application circuit 4b. The via 20n is connected to a connection conductor 26e. The connection conductor 26e is connected to a connection conductor 26f. The connection conductor 26f is connected to, for example, the sense amplifier SA (FIG. 1). The mode of the second selected voltage application circuit 4b is not limited thereto.

Since the mode of the first selected voltage application circuit 4a, the third selected voltage application circuit 4c, and the fourth selected voltage application circuit 4d is the same as the mode of the second selected voltage application circuit 4b, the description and illustration thereof are omitted.

Figure 5:
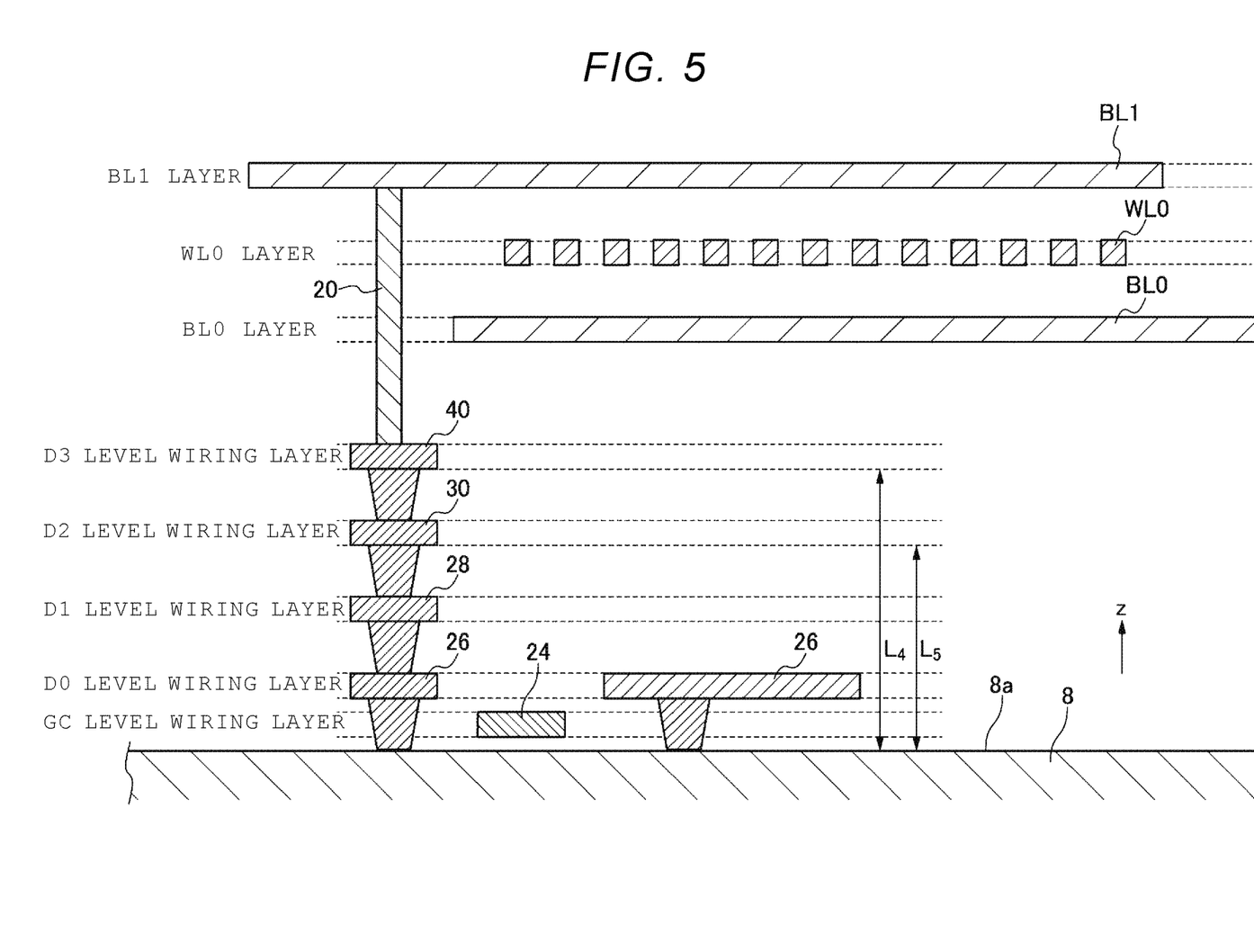
FIG. 5 is a schematic view illustrating a positional relationship among a substrate, a connection conductor, a bit line, and a word line in the embodiment.

FIG. 5 is a schematic view illustrating a positional relationship among the substrate, the connection conductor, the bit line BL, and the word line WL in the embodiment. On the substrate 8, a GC level wiring layer, a D0 level wiring layer, a D1 level wiring layer, a D2 level wiring layer, a D3 level wiring layer, a BL0 layer, a WL0 layer, and a BL1 layer are provided in this order.

The GC level wiring layer is, for example, a layer in which the conductor 24 connected to the gate of the first selected voltage application circuit 4a, the second selected voltage application circuit 4b, the third selected voltage application circuit 4c, the fourth selected voltage application circuit 4d, the first non-selected voltage application circuit 6a, the second non-selected voltage application circuit 6b, the third non-selected voltage application circuit 6c, and the fourth non-selected voltage application circuit 6d is disposed. The GC level wiring layer is a layer in which, for example, the conductor 24a and the conductor 24b (FIGS. 4A and 4B) are arranged.

The D0 level wiring layer is a layer in which, for example, the connection conductor 26a, the connection conductor 26b, the connection conductor 26c, the connection conductor 26d, the connection conductor 26e, and the connection conductor 26f (FIGS. 4A and 4B) are disposed. The D1 level wiring layer is, for example, a layer in which a connection conductor 28 is disposed.

The D2 level wiring layer is, for example, a layer in which the connection conductor 30a and the connection conductor 30b (FIG. 3A) are disposed. The distance between the D2 level wiring layer and the substrate 8 (substrate surface 8a) is L5.

The D3 level wiring layer is, for example, a layer in which the connection conductor 40a and the connection conductor 40b (FIG. 3A) are disposed. The distance between the D3 level wiring layer and the substrate 8 (substrate surface 8a) is L4.

The BL0 layer, the WL0 layer, and the BL1 layer are layers in which BL0, WL0, and BL1 are disposed, respectively. Since the wiring of the BL0 layer, the WL0 layer, and the BL1 layer are in a regular line and space pattern, in order to increase the recording density by providing a large number of memory cells MC, the memory cells MC are formed at a high density by using, for example, a sidewall processing process. On the other hand, the wiring of the BL0 layer, the WL0 layer, and the BL1 layer is thinner than the wiring of the GC level wiring layer, the D0 level wiring layer, the D1 level wiring layer, the D2 level wiring layer, and the D3 level wiring layer. On the other hand, since the GC level wiring layer, the D0 level wiring layer, the D1 level wiring layer, the D2 level wiring layer, and the D3 level wiring layer have a lower regularity than the arrangement of the BL0 layer, the WL0 layer, and the BL1 layer, and there is little room for applying the sidewall processing process, a thicker wiring is formed. For example, the wiring thickness of the GC level wiring layer, the D0 level wiring layer, the D1 level wiring layer, the D2 level wiring layer, and the D3 level wiring layer in the y direction parallel to the substrate 8 (substrate surface 8a) is about four times the wiring thickness of the BL0 layer, the WL0 layer, and the BL1 layer.

Figure 6:
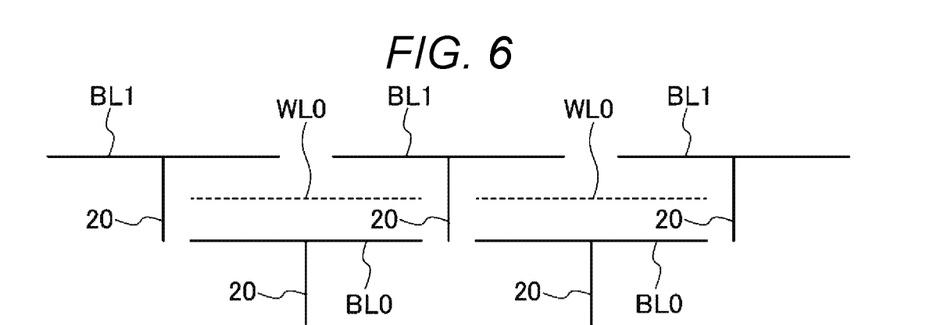
FIG. 6 is a schematic view illustrating a positional relationship between bit line BL0, word line WL0, bit line BL1 and a via in the embodiment.

FIG. 6 is a schematic view illustrating a positional relationship between BL0, WL0, BL1 and a via in the embodiment. On the two BL0s, parts of BL1 overlap each other. For example, taking FIGS. 3A and 3B as an example, a part of BL1-0 overlaps with BL0-0-1 and BL0-0-2. The via 20 is connected to each of BL0 and BL1.

Figure 7A:
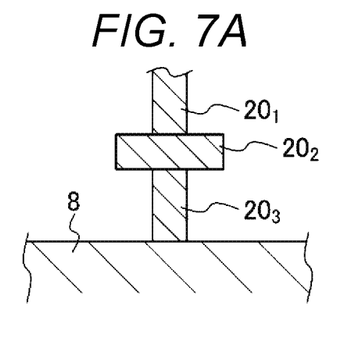
FIGS. 7A and 7B are schematic cross-sectional views illustrating examples of the via shape according to the embodiment.
Figure 7B:
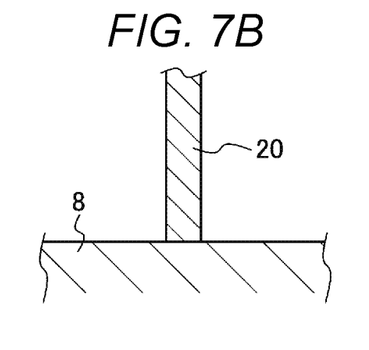

FIGS. 7A and 7B are schematic cross-sectional views illustrating an example of the shape of the via 20 according to the embodiment. For example, the shape of the via 20 may be such that a planar conductor 202 is provided between vias $20_1$ and $20_3$ as illustrated FIG. 7A. The shape of the via 20 may be such that the planar conductor $20_2$ is not provided as illustrated in FIG. 7B, for example. The shape of the via 20 of the embodiment includes both the shape illustrated in FIG. 7A and the shape illustrated in FIG. 7B. For example, in FIG. 7A, the number of planar conductors $20_2$ is not particularly limited.

Next, operational effects of the semiconductor memory device of the embodiment will be described.

In order to increase the degree of integration of the memory cells MC, it is preferable to shorten the length between the memory cell array 1 and the memory cell array 2 in FIG. 3A as much as possible and to reduce the size of the portion where the memory cell MC is not provided as much as possible.

The non-selected voltage application circuit applies a specific voltage to the memory cell MC, and is not always required to apply a large current for data writing to the memory cell MC. On the other hand, the selected voltage application circuit is required to allow a larger current to flow in order to write data to the memory cell MC. Therefore, the selected voltage application circuit has a larger area than the non-selected voltage application circuit on the substrate 8.

For this reason, it is conceivable to dispose the first to fourth non-selected voltage application circuits on the substrate 8 under the memory cell array 1 and the memory cell array 2 to make the array break as short as possible.

Here, a selected voltage generation circuit and a non-selected voltage generation circuit are connected to each BL1. However, as described above, for the D0 level wiring layer, the D1 level wiring layer, the D2 level wiring layer, and the D3 level wiring layer, a wiring that is thicker than the thickness of BL1 is formed unlike the wiring of BL1 and the like. Therefore, the problem is how to connect BL1 to the selected voltage generation circuit and the non-selected voltage circuit by using a wiring thicker (therefore, inevitably low density) than BL1, provided in the D0 level wiring layer, the D1 level wiring layer, the D2 level wiring layer, and the D3 level wiring layer.

One example of where the first to fourth non-selected voltage application circuits are disposed on the substrate 8 under the memory cell array 1 and the memory cell array 2 is as follows: the second non-selected voltage application circuit 6b is disposed between the first selected voltage application circuit 4a and the first non-selected voltage application circuit 6a, and the fourth non-selected voltage application circuit 6d is disposed between the third non-selected voltage application circuit 6c and the third selected voltage application circuit 4c. However, in this example, for the second non-selected voltage application circuit 6b and the first selected voltage application circuit 4a provided adjacent to each other, it is possible to connect to BL1 by using wiring layers in the D0 level wiring layer, the D1 level wiring layer, the D2 level wiring layer, and the D3 level wiring layer. However, for the second selected voltage application circuit 4b provided away from all non-selected voltage application circuits, when connecting to any of the non-selected voltage application circuits and then connecting to BL1 by using the wiring layers in the D0 level wiring layer, the D1 level wiring layer, the D2 level wiring layer, and the D3 level wiring layer, the wiring structure becomes complicated. A similar problem also occurs when the fourth selected voltage application circuit 4d is connected to BL1.

Therefore, in the semiconductor memory device 100 of the embodiment, a part (e.g., second non-selected voltage application circuit 6b and fourth non-selected voltage application circuit 6d) of the non-selected voltage application circuit is not disposed under the array break of the memory cell array 1 and the memory cell array 2, but under each of the memory cell array 1 and the memory cell array 2, respectively. In other words, the non-selected voltage application circuit and the selected voltage application circuit are disposed adjacent to each other. The connection between the second non-selected voltage application circuit 6b and the fourth non-selected voltage application circuit 6d, and BL uses the connection conductor 40a and the connection conductor 40b provided above the connection conductor 30a and the connection conductor 30b used to connect the first non-selected voltage application circuit 6a and the third non-selected voltage application circuit 6c to BL. As a result, BL1 can be easily connected to the non-selected voltage application circuit and the selected voltage application circuit. Therefore, the wiring structure between the memory cell array 1 and the memory cell array 2 and the substrate 8 is simplified.

Unlike the case where the first to fourth non-selected voltage application circuits are each disposed on the substrate 8 under the memory cell array 1 and the memory cell array 2 therebetween, in order to connect the second non-selected voltage application circuit 6b and the fourth non-selected voltage application circuit 6d to BL via the connection conductor 40a and the connection conductor 40b, which are thick wirings, the interval between the vias may not be aligned with the interval between the non-selected voltage application circuits. Accordingly, since the degree of freedom of via arrangement increases, the interval between the memory cell array 1 and the memory cell array 2 can be reduced to increase the degree of integration of the memory cells MC.

As described above, the selected voltage application circuit is required to carry a larger current than the non-selected voltage application circuit in order to write data to the memory cell MC. In the semiconductor memory device of the embodiment, since the second non-selected voltage application circuit 6b and the fourth non-selected voltage application circuit 6d are disposed under the memory cell array, the first selected voltage application circuit 4a, the second selected voltage application circuit 4b, the third selected voltage application circuit 4c, and the fourth selected voltage application circuit 4d can be brought closer to a position below the array break. Therefore, since the length of the via and the connection conductor connecting the selected voltage generation circuit and BL can be shortened, the voltage drop due to the via and the connection conductor can be reduced.

When the ratio of the width L3 of the connection conductor 30a and connection conductor 30b in the direction parallel to the substrate surface 8a and the width L2 of the connection conductor 40a and the connection conductor 40b in the direction parallel to the substrate surface 8a to the widths L1 of BL or WL in the direction parallel to the substrate surface is greater than 2, the structure of the wiring is likely to be particularly complicated, and therefore the semiconductor memory device of the embodiment is preferably used in such cases.

According to the semiconductor memory device of the embodiment, it is possible to provide a semiconductor memory device having a simple wiring structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   first and second wirings above the substrate, extending in a first direction parallel to a substrate surface, and spaced apart from each other in the first direction;
   a plurality of third wirings above the first wiring and the second wiring and extending in a second direction intersecting the first direction;
   fourth and fifth wirings above the plurality of third wirings, extending in the first direction, and spaced apart from each other in the second direction;
   a plurality of memory cells between the first wiring and the third wirings, between the second wiring and the third wirings, between the fourth wiring and the third wirings, and the fifth wiring and the third wirings;
   a first non-selected voltage application circuit on the substrate and under a space between the first wiring and the second wiring in the first direction;
   a second non-selected voltage application circuit on the substrate and under the first wiring;
   a first selected voltage application circuit on the substrate between the first non-selected voltage application circuit and the second non-selected voltage application circuit;
   a second selected voltage application circuit on the substrate between the second non-selected voltage application circuit and the first selected voltage application circuit;
   a first connection conductor between the substrate and the first wiring;
   a second connection conductor between the substrate and the first connection conductor;
   a first connection wiring extending in a third direction intersecting the first direction and the second direction through the space between the first wiring and the second wiring to connect the fourth wiring to the second connection conductor;
   a second connection wiring extending in the third direction to connect the fifth wiring to the first connection conductor;
   third and fourth connection wirings extending in the third direction to connect the second connection conductor to the first non-selected voltage application circuit and the first selected voltage application circuit, respectively; and fifth and sixth connection wirings extending in the third direction to connect the first connection conductor to the second non-selected voltage application circuit and the second selected voltage application circuit, respectively.

2. The semiconductor memory device according to claim 1, wherein
the first and second connection conductors each have a planar surface that is parallel to the substrate surface.

3. The semiconductor memory device according to claim 2, wherein
a ratio of a width of either the first connection conductor or the second connection conductor in the second direction, to a width of the first wiring in the second direction is greater than 2.

4. The semiconductor memory device according to claim 2, wherein
a ratio of a width of either the first connection conductor or the second connection conductor in the second direction, to a width of the first wiring in the second direction is greater than 3.

5. The semiconductor memory device according to claim 1, wherein each of the first and second selected voltage application circuits includes a MOSFET, and the MOSFETs are disposed adjacent to each other.

6. The semiconductor memory device according to claim 1, further comprising:
sixth and seventh wirings above the plurality of third wirings, extending in the first direction, and spaced apart from each other in the second direction, wherein the sixth wiring is between the fourth and fifth wirings and the fifth wiring is between the sixth and seventh wirings;
a third non-selected voltage application circuit on the substrate and under the space between the first wiring and the second wiring in the first direction;
a fourth non-selected voltage application circuit on the substrate and under the second wiring;
a third selected voltage application circuit on the substrate between the third non-selected voltage application circuit and the fourth non-selected voltage application circuit;
a fourth selected voltage application circuit on the substrate between the fourth non-selected voltage application circuit and the third selected voltage application circuit;
a third connection conductor between the substrate and the second wiring;
a fourth connection conductor between the substrate and the third connection conductor;
a seventh connection wiring extending in the third direction through the space between the first wiring and the second wiring to connect the sixth wiring to the fourth connection conductor;
an eighth connection wiring extending in the third direction to connect the seventh wiring to the third connection conductor;
ninth and tenth connection wirings extending in the third direction to connect the fourth connection conductor to the third non-selected voltage application circuit and the third selected voltage application circuit, respectively; and
eleventh and twelfth connection wirings extending in the third direction to connect the third connection conductor to the fourth non-selected voltage application circuit and the fourth selected voltage application circuit, respectively.

7. The semiconductor memory device according to claim 6, wherein
the third and fourth connection conductors each have a planar surface that is parallel to the substrate surface.

8. The semiconductor memory device according to claim 7, wherein
a ratio of a width of either the third connection conductor or the fourth connection conductor in the second direction, to a width of the second wiring in the second direction is greater than 2.

9. The semiconductor memory device according to claim 7, wherein
a ratio of a width of either the third connection conductor or the fourth connection conductor in the second direction, to a width of the second wiring in the second direction is greater than 3.

10. The semiconductor memory device according to claim 6, wherein each of the third and fourth selected voltage application circuits includes a MOSFET, and the MOSFETs are disposed adjacent to each other.

11. The semiconductor memory device according to claim 6, wherein
a distance between the first connection conductor and the substrate is equal to a distance between the third connection conductor and the substrate, and
a distance between the second connection conductor and the substrate is equal to a distance between the fourth connection conductor and the substrate.

12. A semiconductor memory device comprising:
a substrate;
first and second wirings above the substrate, extending in a first direction parallel to a substrate surface, and spaced apart from each other in the first direction;
a plurality of third wirings above the first wiring and the second wiring and extending in a second direction intersecting the first direction;
fourth, fifth, sixth, and seventh wirings above the plurality of third wirings, extending in the first direction, and spaced apart from each other in the second direction;
a plurality of memory cells between each of the third wirings and each of the first, second, fourth, fifth, sixth, and seventh wirings; and
first, second, third, fourth, fifth, sixth, seventh, and eight voltage application circuits arranged in that order on the substrate along the first direction, wherein
the first, fourth, fifth, and eighth voltage application circuits are non-selected voltage application circuits, and the second, third, sixth, and seventh voltage application circuits are selected voltage application circuits, and
the first and eight voltage application circuits are below the first and second wirings, respectively, and the fourth and fifth voltage application circuits are below the space between the first and second wirings.

13. The semiconductor memory device according to claim 12, further comprising:
a first connection conductor that electrically connects the fourth wiring to the fourth voltage application circuit through a first connection wiring and a second connection wiring, and to the third voltage application circuit through the first connection wiring and a third connection wiring;
a second connection conductor that electrically connects the fifth wiring to the fifth voltage application circuit through a fourth connection wiring and a fifth connection wiring, and to the sixth voltage application circuit through the fourth connection wiring and a sixth connection wiring;

a third connection conductor that electrically connects the sixth wiring to the first voltage application circuit through a seventh connection wiring and an eighth connection wiring, and to the second voltage application circuit through the seventh connection wiring and a ninth connection wiring; and a fourth connection conductor that electrically connects the seventh wiring to the eighth voltage application circuit through a tenth connection wiring and an eleventh connection wiring, and to the seventh voltage application circuit through the tenth connection wiring and a twelfth connection wiring.

14. The semiconductor memory device according to claim 13, wherein
each of the second, third, sixth and seventh voltage application circuits includes a MOSFET, and
the MOSFETs of the second and third voltage application circuits are disposed adjacent to each other, and the MOSFETS of the sixth and seventh voltage application circuits are disposed adjacent to each other.

15. The semiconductor memory device according to claim 14, wherein
a distance between the first connection conductor and the substrate is equal to a distance between the second connection conductor and the substrate, and
a distance between the third connection conductor and the substrate is equal to a distance between the fourth connection conductor and the substrate.

16. The semiconductor memory device according to claim 15, wherein
the first, second, third, and fourth connection conductors each have a planar surface that is parallel to the substrate surface.

17. The semiconductor memory device according to claim 16, wherein
a ratio of a width of any of the first, second, third, and fourth connection conductors in the second direction, to a width of either the first wiring or the second wiring in the second direction is greater than 2.

18. The semiconductor memory device according to claim 16, wherein
a ratio of a width of any of the first, second, third, and fourth connection conductors in the second direction, to a width of either the first wiring or the second wiring in the second direction is greater than 3.

* * * * *